United States Patent
Kostner et al.

(10) Patent No.: US 9,364,953 B2
(45) Date of Patent: Jun. 14, 2016

(54) KINEMATIC HOLDING SYSTEM FOR A PLACEMENT HEAD OF A PLACEMENT APPARATUS

(71) Applicant: Besi Switzerland AG, Cham (CH)

(72) Inventors: Hannes Kostner, Absam (AT); Dietmar Lackner, Söll (AT); Florian Speer, Wörgl (AT); Martin Widauer, Wörgl (AT)

(73) Assignee: Besi Switzerland AG, Cham (CH)

( * ) Notice: Subject to any disclaimer, the term of this patent is extended or adjusted under 35 U.S.C. 154(b) by 245 days.

(21) Appl. No.: 13/949,000

(22) Filed: Jul. 23, 2013

(65) Prior Publication Data
US 2014/0030052 A1    Jan. 30, 2014

(30) Foreign Application Priority Data

Jul. 24, 2012   (DE) .......................... 10 2012 014 558

(51) Int. Cl.
*B23P 19/00* (2006.01)
*B25J 15/00* (2006.01)
*B25J 17/02* (2006.01)
*H05K 13/04* (2006.01)

(52) U.S. Cl.
CPC .......... *B25J 15/0095* (2013.01); *B25J 17/0208* (2013.01); *H05K 13/0413* (2013.01)

(58) Field of Classification Search
CPC .. B25J 9/1045; B25J 15/0095; B25J 17/0208; B25J 17/0283; H05K 13/0015; H05K 13/0053; H05K 13/0413; H05K 13/046; Y10T 29/5313; Y10T 29/53174; Y10T 29/53261

USPC ................. 29/739, 740, 742, 743; 414/749.6; 901/40

See application file for complete search history.

(56) References Cited

U.S. PATENT DOCUMENTS

| 5,324,381 | A | 6/1994 | Nishiguchi |
| 5,523,678 | A | 6/1996 | Mitsui |

(Continued)

FOREIGN PATENT DOCUMENTS

| EP | 2 007 187 A1 | 12/2008 |
| EP | 2 088 844 A1 | 8/2009 |

(Continued)

OTHER PUBLICATIONS

Examination Report in Singapore Application No. 2013047378, mailed Nov. 5, 2014.
Search Report in Singapore Application No. 2013047378, mailed Nov. 5, 2014.

*Primary Examiner* — Paul D Kim
(74) *Attorney, Agent, or Firm* — Nixon Peabody LLP

(57) ABSTRACT

A kinematic holding system for a placement head of a placement apparatus comprises a placement head alignment device which comprises at least one length-variable holding member arranged at a distance from a joint between a placement head support and the placement head. This holding member determines the pivoting position of the placement head relative to the placement head support. The length of the holding member is changeable during the placement operation depending on a deformation of the placement head guide device caused by the pressing force of the placement head against the substrate in such a way that an axis error (tilt) of the placement head caused by the deformation of the placement head guide device is compensated.

13 Claims, 6 Drawing Sheets

(56) References Cited

U.S. PATENT DOCUMENTS

| | | | | |
|---|---|---|---|---|
| 5,614,118 | A | * | 3/1997 | Weber ................ B29C 65/203 219/243 |
| 5,697,480 | A | * | 12/1997 | Herbermann ......... B25J 19/063 192/150 |
| 8,442,661 | B1 | * | 5/2013 | Blackwell ............. B25J 9/1689 700/245 |

2010/0215462 A1    8/2010   Gortzen et al.

FOREIGN PATENT DOCUMENTS

| | | |
|---|---|---|
| JP | 2000-243764 | 9/2000 |
| JP | 2000-332495 | 11/2000 |
| WO | 98/14041 A1 | 4/1998 |
| WO | 2008/052594 | 5/2008 |

\* cited by examiner

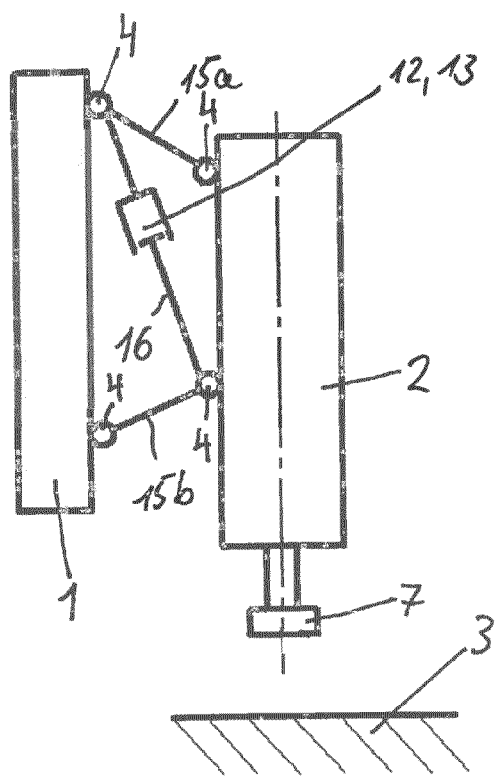
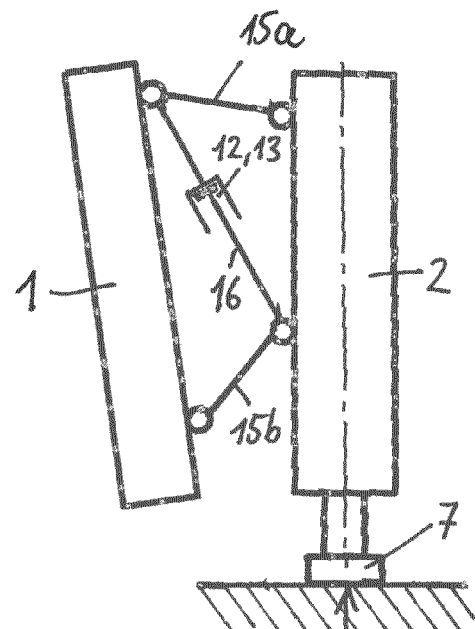
Fig. 12  Fig. 13
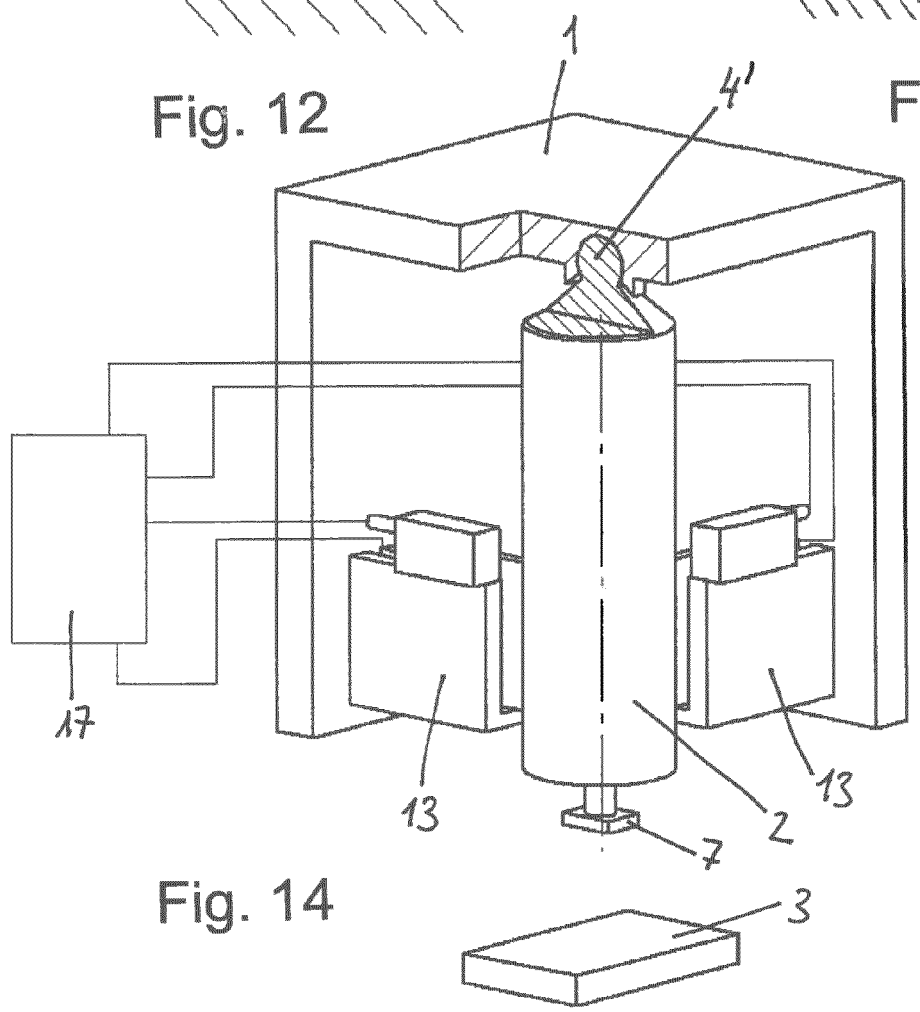
Fig. 14

KINEMATIC HOLDING SYSTEM FOR A PLACEMENT HEAD OF A PLACEMENT APPARATUS

PRIORITY CLAIM

Applicant hereby claims foreign priority under 35 U.S.C §119 from German Application No. 102012014558.6 filed Jul. 24, 2012, the disclosure of which is herein incorporated by reference.

FIELD OF THE INVENTION

The invention concerns a kinematic holding system for a placement head of a placement apparatus for mounting electronic or optical components on substrates, particularly in the semiconductor industry.

BACKGROUND OF THE INVENTION

Placement apparatuses in the semiconductor industry need to operate with high precision and high throughput. One example for such placement apparatuses are die-bonders or pick-and-place machines with which components in form of semiconductor chips are placed and bonded on substrates such as lead frames. The components are received in a picking station by the placement head, especially by means of suction, moved via an XYZ handling system of the placement apparatus to the point of placement above the substrate, and placed thereafter at a precisely defined position on the substrate. The placement head is fixed to a placement head support and coupled to the XYZ handling system via said support. The Z direction usually corresponds to the vertical direction, whereas the XY plane forms the horizontal plane.

In addition to a highly precise placement of the components in the XY plane, it is further very important that the components are also placed in a plane-parallel manner on the substrate. Tilted placement of the components can lead to undesirable properties such as reduced holding force, worse or missing electric contacts, uneven heat transfer between the components and the substrate, or damage to the components.

During the placement process it is a considerable problem that when the component is pressed onto the substrate reaction forces will be produced as a result of the generated pressing forces which are far from inconsiderable, which reaction forces can lead to a deformation of the placement head guide device, i.e. the placement head support and/or the XYZ handling system. In a placement head which is rigidly connected to the placement head support this deformation leads to a tilting of the placement head and therefore to an axis error ("tilt") which produces a respective inclined position of the component relative to the surface of the substrate and furthermore to an undesirable offset of the component in the XY plane.

Such a deformation which occurs in the state of the art is schematically shown in FIG. 2. The axial or inclination error which is caused by the deformation-induced tilting of the placement head 2 together with the placement head support 1, starting from the unloaded position as shown in FIG. 1, is designated therewith "tilt". The additionally occurring lateral offset at the bottom end of the placement head 2 on which the not shown component is held is designated with "a". "F" indicates the reaction force acting on the placement head 2, which reaction force is produced by the pressing force when the placement head 2 is pressed perpendicularly onto the substrate 3.

It is known for avoiding this undesirable axis error to make the placement head support as stiffly as possible. Despite optimized technology in lightweight construction, this inevitably also leads to a relatively large mass. As a result of the massive configuration, the throughput of the placement apparatus will decrease considerably at given drive power. Furthermore, it can never be prevented entirely even in the case of a highly massive arrangement of the placement head support that the placement head will always yield slightly at its tip which accommodates the components when it is pressed onto the substrate.

It is a further known approach to arrange the placement head support in a symmetrical way. In the case of this symmetrical arrangement, the placement head will be supported evenly on both sides. Although this prevents the tilting of the placement head which is caused by the pressing force, the arrangement of the placement apparatus, and in particular the placement head support and the placement head, will be limited very strongly with respect to its design. This leads to disadvantages in machine design like reduced accessibility, as well as complex or a high number of components.

A placement head holding system is known from WO 2008/052594 A1. The placement head is tiltably fixed there to the tool holder by means of a sliding joint which comprises an air bearing. The compensation of the inclined position of the placement head occurs in such a way that the placement head is placed without the component with released air bearing on the substrate, wherein the placement head will automatically align relative to the placement head support in such a way that the bottom face of the placement head is parallel to the substrate surface. The air bearing is locked thereafter and the placement head lifted from the substrate. The adjusted tilting angle of the placement head relative to the placement head support is maintained in this process and is used for the subsequent placement processes. Furthermore, an adjusting apparatus is indicated in a merely symbolic manner, by means of which a positioning of the placement head is possible with activated air bearings when a specific tilting position is to be set without pressing against substrate. WO 2008/052594 A1 therefore merely concerns a presetting of the placement head which is performed prior to the actual placement process. A continuous compensation of the axis error of the placement head during the placement process is not possible with this known holding system.

SUMMARY OF THE INVENTION

The invention is therefore based on the object of providing a holding system for a placement head which enables a highly precise, plane-parallel placement of the components on the substrate with high placement force and high throughput, even with asymmetric placement head supports, without having to arrange the placement head guide device in an especially stiff manner.

In a holding system in accordance with the invention, the placement head alignment device comprises at least one length-variable holding member which is arranged at a distance from a joint between the placement head support and the placement head, and which determines the pivoting position of the placement head relative to the placement head support and whose length is variable during the placement operation depending on a deformation of the placement head guide device caused by the pressing force of the placement head on the substrate in such a way that an axis error of the placement head which is caused by the deformation of the placement head guide device is compensated.

It is therefore characteristic for the holding system in accordance with the invention according to claim 1 that a length-variable holding member is provided, wherein the holding member, as a result of its change in length, produces a pivoting movement of the placement head relative to the placement head support about the joint via which the placement head is supported on the placement head support. The length-variable holding member may concern a passive element in the form of a spring, or an active element in the form of a travel-controlled or force-controlled actuator.

This allows adjusting the inclination, i.e. the tilting position of the placement head, in a continuous way during the placement operation to any deformations of the placement head guide device, i.e. the XYZ handling system and/or the placement head support. A kinematic holding device for a placement head is therefore created which enables minimization of the placement error in combination with simultaneous avoidance of high stiffness. The invention therefore allows the achievement of a distinct reduction in the mass, by means of which the placement throughput will be increased substantially in combination with the same drive power.

In accordance with an advantageous embodiment, the length-variable holding member has a longitudinal axis which is arranged parallel to the longitudinal axis of the placement head, wherein the holding member and the joint are especially arranged on opposite sides of the longitudinal axis of the placement head. As a result, the reaction force which is produced during the pressing of the component against the substrate can be transferred in a simple manner both via the joint and also via the length-variable holding member from the placement head onto the placement head support. The length of the holding member will then be adjusted according to the deformation-induced displacement of the joint in a passive manner, especially by means of a spring, or in an active manner by actuators, so that the desired axial position of the placement head is also maintained during any deformation of the placement head guide device.

It is principally possible that the longitudinal axis of the length-variable holding member is arranged at a random angle of between 0° and 90°, especially also transversely, i.e. at 90°, to the longitudinal axis of the placement head.

In accordance with an advantageous embodiment, the placement head alignment device comprises a plurality of joint rods which are connected via joints both to the placement head and also to the placement head support, and hold the placement head in a predetermined variable position relative to the placement head support, wherein the relative position of the joint rods is variable by means of the length-variable holding member in such a way that the deformation-induced axis error of the placement head is compensated.

According to an advantageous embodiment, the length-variable holding member consists of a passive element in the form of a spring which is arranged in such a way between the placement head support and the placement head that the pressing force is transferred from the placement head support to the placement head by the joint on the one hand and via the spring on the other hand, wherein the reaction force produced by the pressing force produces a change in length of the spring. This change in length is adjusted to a deformation-induced displacement of the joint in such a way that the angular position of the placement head relative to the substrate is maintained during the pressing process even in the case of a deformation of the placement head guide device.

Alternatively, the length-variable holding member can also consist of a travel-controlled or force-controlled actuator, especially an electric direct drive, a voice coil or a piezo drive. Stepper motors, DC motors or servomotors can especially be considered as electric direct drives.

In the event of insufficient force effect, a transmission can be provided in the form of a lever arrangement or in the form of a gear with which the actuator acts on the axial position of the placement head. A spindle drive can especially be considered as the gear.

The placement head alignment device preferably comprises a motion blocking device for blocking relative movements of the placement head relative to the placement head support. Uncontrolled free movements of the placement head relative to the placement head support can be prevented in this manner when the placement head is rapidly displaced, accelerated and braked. Such a blockage of movement will appropriately be formed in such a way that the actuators are built as lockable actuators. It is also possible as an alternative to provide a locking device in addition to the actuators between the placement head and the placement head support, which locking device is separated from the actuators.

Preferably, the placement head is suspended in its upper or bottom end region in pendulum fashion on the placement head support and supported in the Z direction by means of a joint which has at least one rotary degree of freedom. Furthermore, at least one length-variable holding member for adjusting the inclination of the placement head relative to the placement head support is provided in this case beneath or above the joint. The placement head is therefore arranged in this case as a one-dimensional or multi-dimensional pendulum, especially a two-dimensional pendulum. The joint can be built especially as a single-axis joint, ball-and-socket joint or a universal joint (also known as Cardan joint).

Preferably, a plurality of length-variable holding members is provided, which are arranged in such a way that they act on the placement head from different directions, so that the placement head is pivotable in a multi-dimensional way in space. This allows a purposeful adjustment of the inclination of the placement head in space in order to compensate deformation-induced axis errors of the placement head.

The initially mentioned object is further achieved by a kinematic holding system according to claim 15. In accordance with this embodiment, the placement head alignment device comprises at least one solid joint element with at least one first solid joint arm which is rigidly connected to the placement head support, and at least one second solid joint arm which is rigidly connected to the placement head and elastically connected to the first solid joint arm by means of a solid joint. The second solid joint arm is deformable in relation to the first solid joint arm depending on a deformation of the placement head support caused by the pressing force of the placement head on the substrate in such a way that an axis error of the placement head caused by the deformation of the placement head support is compensated.

Preferably, the rotational axis of the joint is arranged relative to a deformation rotational axis about which the deformation of the placement head guide device occurs in reaction to the pressing force in such a way that straight lines through the rotational axis of the joint and the deformation rotational axis in the unloaded and loaded state of the placement head are disposed in an angular range of between −45° and +45° with respect to a horizontal plane in which the deformation rotational axis 25 is disposed. This not only allows to compensate the axis error, but also to minimize the lateral offset by which the component is displaced by the deformation of the placement head guide device in the XY plane. This minimization of the lateral offset will be especially effective when according to an advantageous embodiment the rotational axis of the joint lies beneath the deformation rotational axis in the unloaded state of the placement head, and above the deformation rotational axis under full placement force. It is especially advantageous if at half the placement force the rotational axis of the placement head is situated at the same level as the rotational axis of the placement head guide device, because in this case the lateral offset is especially low in the end position of the component, or it can be avoided completely.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are drawn schematically and not to scale. In the drawings:

FIG. 12 shows a side view of a third embodiment of the invention in the unloaded state;

FIG. 13 shows the arrangement of FIG. 12 when pressed against a substrate;

FIG. 14 shows a spatial, partly sectional representation of a fourth embodiment of the invention;

DETAILED DESCRIPTION OF THE INVENTION

Figure 1:
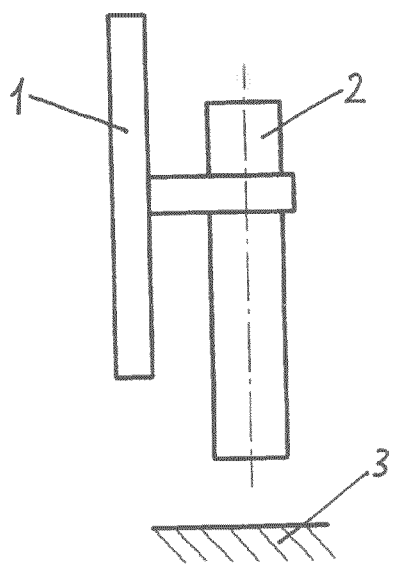
FIG. 1 shows a schematic illustration of a placement head in the unloaded position which is rigidly connected to the placement head support, according to the state of the art.

FIGS. 5 to 8 are used for illustrating a first embodiment of the kinematic holding system in accordance with the invention.

The holding system comprises a placement head support 1 on which a placement head 2 of a placement apparatus is mounted in an articulated manner by means of a joint 4. The placement head 2 carries at the bottom end a component holder 5 with a bottom contact surface 6 in order to hold an electronic or optical component 7 especially by means of negative pressure. The component 7 rests in a plane-parallel manner on the bottom contact surface 6.

Such a placement apparatus is used in the known manner to receive the component 7 in a picking station (not shown), to move it by means of an XYZ handling system to a precisely predetermined location above the substrate 3, and to subsequently place the component 7 on the substrate 3. The placement head support 1 is part of a placement head guide device 18 which is merely shown in FIG. 15 and which comprises several carriages that will be described below in closer detail and enables a displacement and a precise guidance of the placement head 2 in the X, Y and Z direction. The kinematic placement head holding system in accordance with the invention can also be used together with other placement head guide devices or handling systems, especially rθ handling systems, in which the position of the placement head is determined by the distance from a rotational axis and an angular position.

Figure 5:
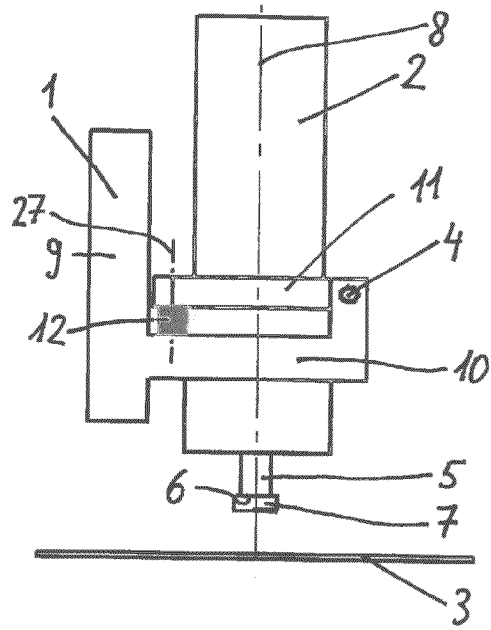
FIG. 5 shows a side view of a placement head and a placement head support comprising a placement head alignment device according to a first embodiment of the invention in the unloaded state.

In the illustrated embodiment (FIGS. 5 to 8), the substrate 3 lies in the XY plane and therefore in a horizontal plane. The longitudinal axis 8 of the placement head 2 is arranged vertically in the unloaded state of the placement head 2, which is shown in FIGS. 5 and 7, and therefore extends in the Z direction.

Figure 15:
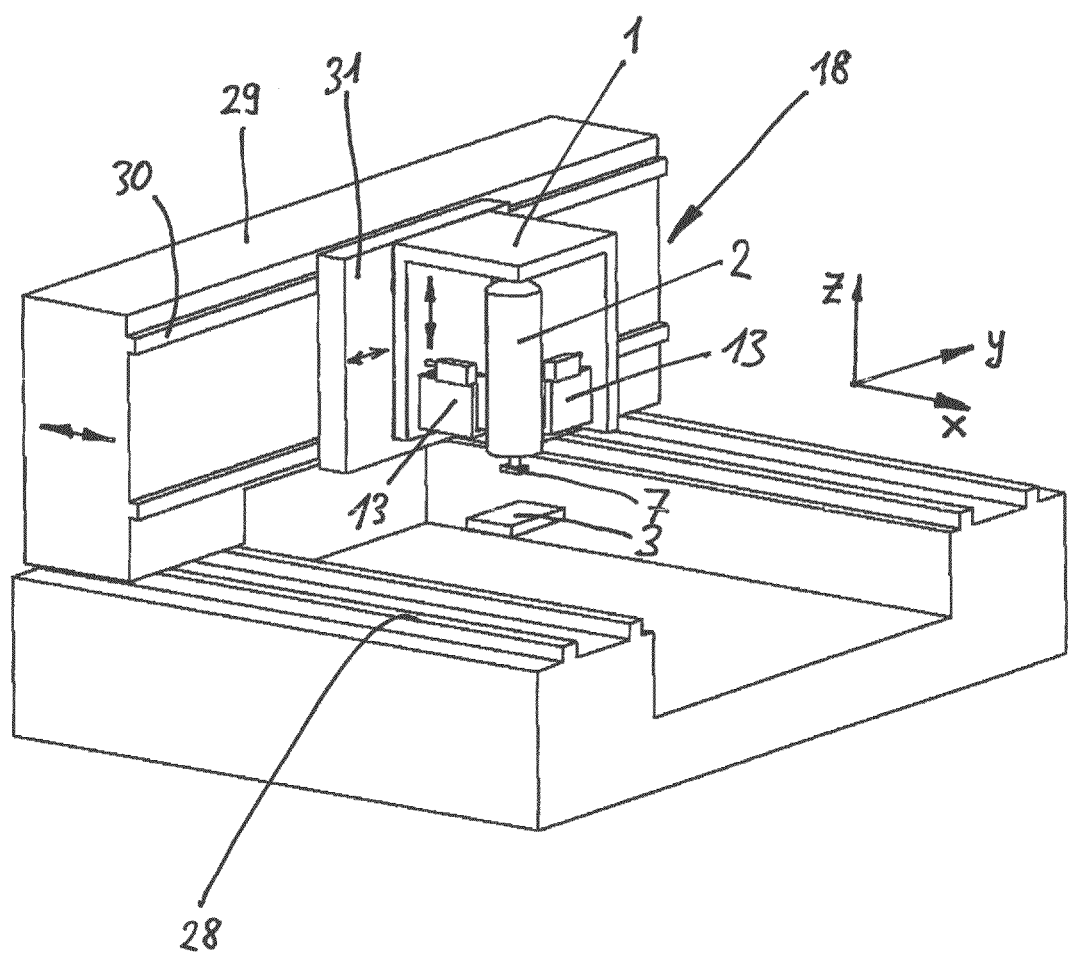
FIG. 15 shows the arrangement of FIG. 14 together with an XYZ handling system.
Figure 16:
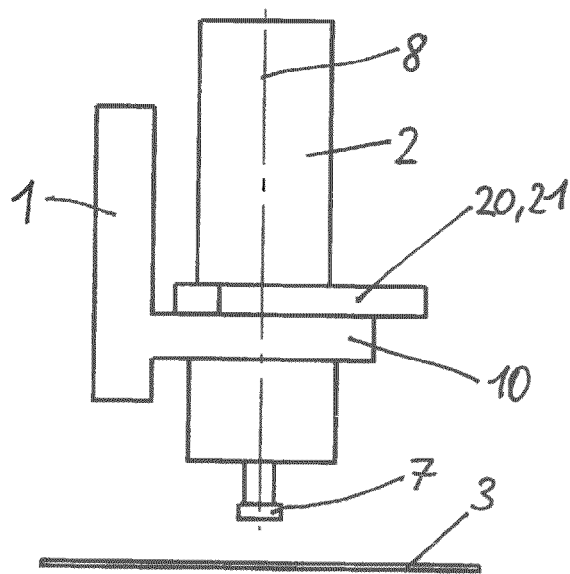
FIG. 16 shows a side view of a fifth embodiment of the invention in the unloaded state.

The placement head support 1, which is shown in FIGS. 5 to 8, is built asymmetrically and comprises a guide section 9 which is guided for example on a Y-carriage 31 (as shown in FIG. 15) and which is merely disposed on one side of the placement head 2. A horizontal support arm 10 extends from the guide section 9 to the opposite side of the placement head 2, with the joint 4 being arranged at the end of said support arm 10. The joint 4 and the guide section 9 are therefore disposed on opposite sides of the placement head 2.

A console 11 is fixed to the placement head 2, said console 11 surrounding the placement head 2 in the manner of a flange and being arranged with vertical distance from the support arm 10. The console 11 is connected on the one side of the placement head 2 via the joint 4 in an articulated and therefore pivotable manner to the support arm 10. On the opposite side of the placement head 2, the console 11 is supported on the support arm 10 by means of a length-variable holding member in form of a spring 12. The change in length of the spring 12 therefore changes the angle which the console 11 and therefore the placement head 2 assume relative to the placement head support 1.

Figure 6:
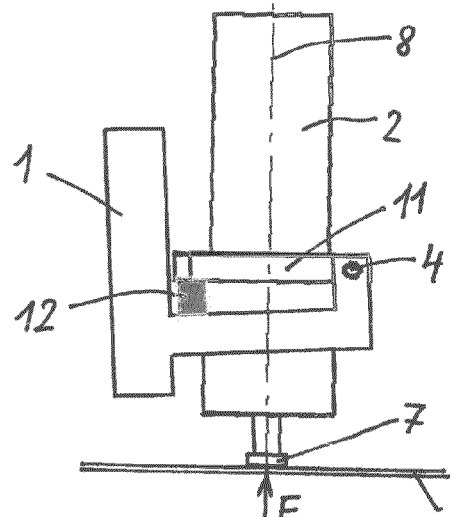
FIG. 6 shows a side view of the arrangement of FIG. 5 during pressing against a substrate.
Figure 7:
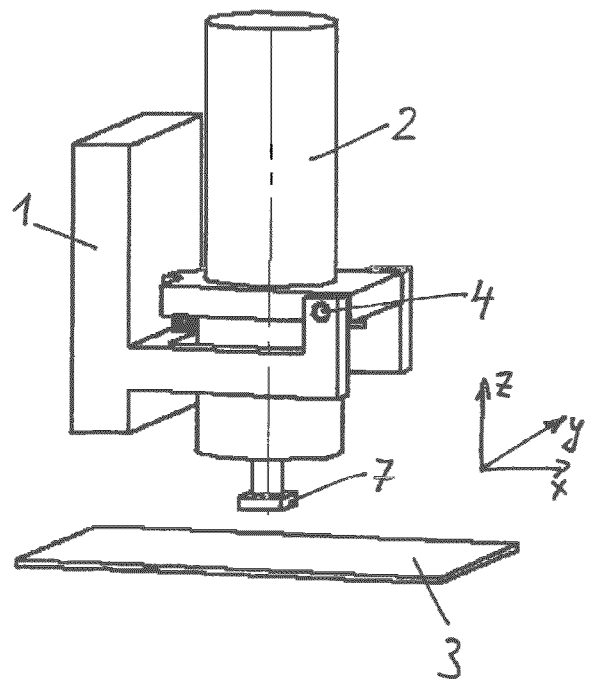
FIG. 7 shows the arrangement of FIG. 5 in a spatial representation.
Figure 8:
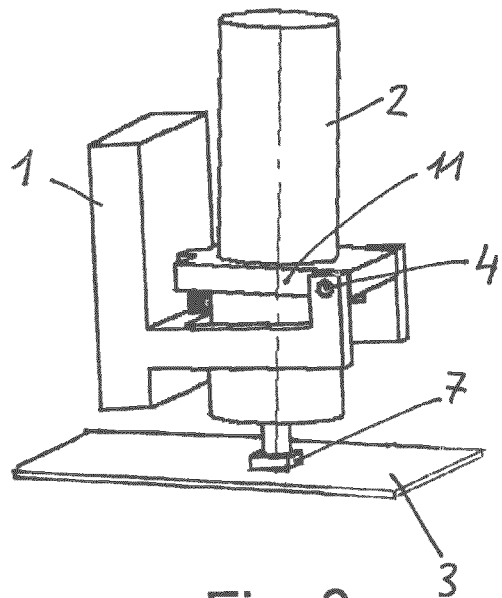
FIG. 8 shows the arrangement of FIG. 6 in a spatial representation.

When the placement head 2 is displaced downwardly and the component 7 is pressed against the substrate 3, a reaction force F which corresponds to the pressing force is exerted on the placement head 2 and the placement head support 1, as is shown in FIG. 6. Said reaction force F is transferred from the placement head 2 to the placement head support 1 both via the joint 4 and also via the spring 12. If this reaction force leads to a deformation of the placement head guide device 18 and therefore to an inclined position of the placement head support 1 (as shown in FIGS. 6 and 8), this deformation is compensated by a change in length of the spring 12 in such a way that the original alignment of the placement head 2 (i.e. its vertical alignment) is maintained. For this purpose the stiffness of the spring 12 is adjusted to the stiffness of the entire system in such a way that the change in length of the spring 12 corresponds to the deformation-induced displacement of the joint 4 in the Z direction. Consequently, the console 11 will always be held in the horizontal position irrespective of any deformation-induced inclined position of the placement head support 1. The angular position of the placement head 2 relative to the substrate 3 is therefore maintained during the pressing process, even in the case of a deformation of the placement head guide device 18.

Figure 11:
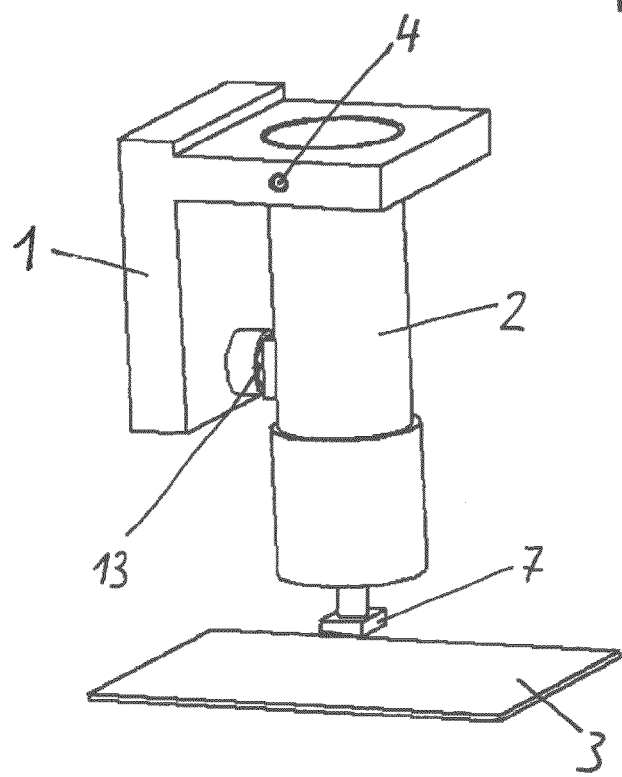
FIG. 11 shows the arrangement of FIG. 9 in a spatial representation.

A second embodiment of the holding system in accordance with the invention will be explained below by reference to FIGS. 9 to 11.

In this embodiment, the placement head 2 is supported in its upper end region in an articulated manner by means of a single-axis joint 4 on the support arm 10 of the placement head support 1, which support arm is held on one side. In FIG. 9, the support arm 10 extends again in the horizontal direction, whereas the longitudinal axis of the placement head 2 extends in the vertical direction. The placement head 2 is mounted in pendulum fashion on the placement head support 1 via the joint 4. The relative position of the placement head 2 relative to the placement head support 1 is set there by way of a length-variable holding member in form of a travel-controlled or force-controlled actuator 13, which rests on the one hand on the placement head support 1 and on the other hand on the placement head 2. The drawing shows that in this embodiment the longitudinal axis 14 of the actuator 13 extends horizontally and therefore perpendicularly to the longitudinal axis 8 of the placement head 2. Furthermore, the longitudinal axis 14 intersects the longitudinal axis 8 in a point of intersection S, which is disposed with substantial distance beneath the joint 4. This allows producing relatively large torques about the joint 4 with relatively low actuating forces of the actuator 13. In the case of a respective extension or reduction in length of the actuator 13, the angle of the placement head 2 relative to the placement head support 1 changes in such a way that the tilt axis error is compensated.

The actuator 13 may especially be an electric direct drive, a voice coil or a piezo drive.

Figures 9, 10:
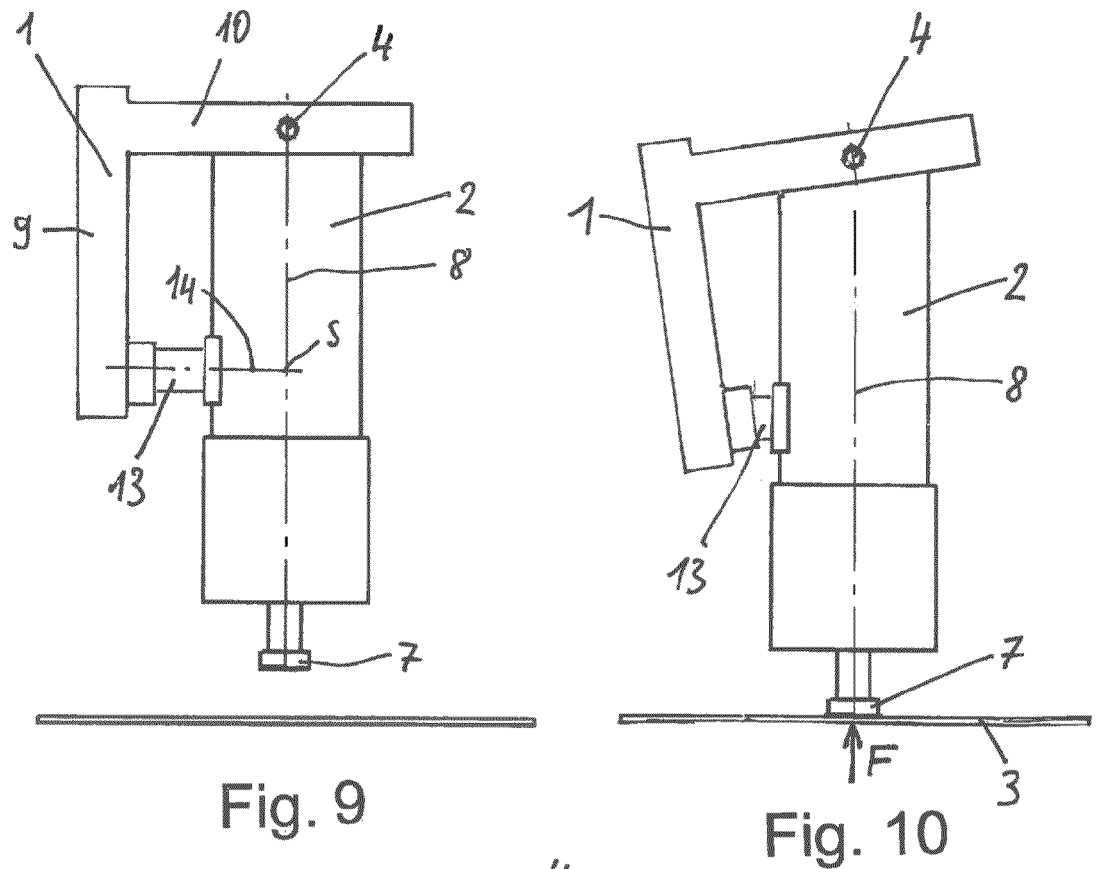
FIG. 9 shows a side view of a second embodiment of the invention in the unloaded state.
FIG. 10 shows a side view of the arrangement of FIG. 9 when pressed against a substrate.

If a deformation of the placement head guide device 18 occurs during the pressing of the placement head 2 against the substrate 3, as is schematically shown in FIG. 10, the actuator 13 will be reduced in length in the illustrated embodiment in such a way that the vertical alignment of the placement head 2 is maintained. This means in other words that the placement head 2 is pivoted relative to the placement head support 1 about the same angle about which the placement head support 1, as a result of the reaction force F, tilts relative to the starting position.

The respective drive control of the actuator 13 occurs in such a way that the reaction forces F acting on the holding system or the deformation paths are measured by suitable sensors and the output signals of these sensors are converted by a suitable control device into actuating signals for the actuator 13.

A third embodiment of the invention will be explained by reference to FIGS. 12 and 13. In this embodiment, the placement head 2 is connected via a special rod kinematic system in form of joint rods 15a, 15b and a length-variable holding member in form of a length-variable joint rod 16. The joint rods 15a, 15b, 16 are connected to the placement head support 1 on the one hand and to the placement head 2 on the other hand in an articulated manner, and arranged in such a way that a specific angular position of the placement head 2 relative to the placement head support 1 is maintained at a predetermined length of the joint rod 16. Any change in the length of the joint rod 16 produces a change in the angle of the joint rods 15a, 15b and therefore a change in the angle of the placement head 2 relative to the placement head support 1.

The change in length of the two-part joint rod 16 occurs either via a passive holding member in the form of a spring 12 or an active holding member in form of a travel-controlled or force-controlled actuator 13, which can be controlled in the same manner as described in connection with the second embodiment.

If a deformation or a tilting of the placement head support 1 relative to the placement head 2 occurs during pressing of the placement head 2 or the component 7 against the substrate 3 as a result of the reaction force F, which deformation produces a respective change in the angle of the joint rods 15a, 15b, the length of the joint rod 16 is changed in such a way (reduced in length in the embodiment) that the desired alignment of the placement head 2 (i.e. the vertical position) relative to the substrate 3 will be maintained.

A fourth embodiment of the invention will be explained by reference to FIGS. 14 and 15. This embodiment operates similarly to the embodiment as explained with reference to FIGS. 9 to 11, wherein the placement head 2 is not built as a one-dimensional pendulum but as a pendulum that can be pivoted multi-dimensionally. For this purpose, the placement head 2 comprises a joint 4' at its upper end which represents a spherical bearing. It may especially be an air bearing, a hydrostatic bearing, a mechanical spherical head bearing or a ball-bearing spherical head bearing. Furthermore, the joint 4' can also be arranged as a universal joint or a multi-axial solid joint.

The position of the placement head 2, i.e. its pivoting position relative to the placement head support 1, is determined by two actuators 13 which are arranged angularly with respect to each other and which act in a bottom region of the placement head 2 on said placement head. As is shown in the drawings, the two actuators 13 are expediently arranged at a right angle with respect to each other, wherein one actuator 13 acts in the X direction and the other actuator 13 in the Y direction. By reducing or extending the length of one or both actuators 13, a pivoting movement of the placement head 2 can be performed in space, by means of which the tilt and therefore the angle of the bottom surface of the component 7 relative to the substrate 3 can be changed and adjusted.

The actuators 13 may again be travel-controlled or force-controlled drives, which are connected with direct linkage or via a suitable kinematic system (i.e. via levers or a gear) to the placement head 2 on the one hand and the placement head support 1 on the other hand.

FIG. 14 shows further that the actuators 13 are connected via electrical lines to a control unit 17, via which they receive respective move commands.

The placement process is appropriately performed in such a way that the actuators 13 which cooperate with the placement head 2 are blocked expediently until contact of the component 7 with the substrate 3, so that during the rapid displacement of the placement head 2 no uncontrolled pendulum movements of the placement head 2 occur. The blockage of the actuators 13 is released directly before the touchdown of the placement head 2 or the component 7 on the substrate 3, thereby allowing a free movement of the placement head 2 about the joint 4'. During pressing of the component 7 against the substrate 3, the reaction force F which corresponds to the pressing force propagates via the joint 4' and the placement head support 1 to the XYZ handling system and leads to a deformation of the same. The two actuators 13 are controlled via the control unit 17 in such a way that they change the distance of the placement head 2 from the placement head support 1 in the X and/or Y direction in such a way that the predetermined alignment of the placement head 2 (the vertical alignment in the present case) is maintained.

The placement head guide device 18, which is schematically shown in FIG. 15, can be used in all embodiments of the invention. It comprises X guides 28, on which a transverse carriage 29 is movable in the X direction. The transverse carriage 29 comprises Y guides 30 on which a Y carriage 31 is movable in the Y direction. Z guides (not shown in closer detail) are provided on the Y carriage 31, on which the placement head support 1 is movable in the Z direction. The X guides 28, the transverse carriage 29, the Y carriage 31 and the Z guides between the Y carriage 31 and the placement head support 1 are part of the XYZ handling system.

The placement head compensation apparatus in accordance with the invention is not limited to the use in such a placement head guide device 18. Instead, a combination with random placement head guide devices is possible.

The alternative possibilities for operating the kinematic holding systems in accordance with the invention, in which active holding members such as actuators 13 are used for axis error compensation, can be described as follows:
1. Once the component 7 touches the substrate 3 during the placement process, the actuator(s) 13 will be switched to be force-free. The friction between the substrate 3 and the component 7 fixes the component 7. The occurring deformations will be compensated during the application of the pressing force.
2. As soon as the component 7 touches the substrate 3, the actuator(s) 13 will exert a specific force or variable forces in order to keep the component 7 at position.
3. After the component 7 has touched the substrate 3, the actuator(s) 13 will be displaced along a specific path in order to keep the component 7 at position.

The angle between the placement head support 1 and the substrate 3 can therefore be set by means of the actuator/actuators 13. The displacement of an actuator 13 can change the axial position of the placement head 2 in relation to the substrate 3 and consequently the angle between the placement head 2 and the substrate 3 can be kept constant at the required value despite the change in the angle of the placement head support 1. As a result of the two-axial embodiment of actuators 13 as shown in FIGS. 14 and 15, the angle can also be kept constant in space.

A fifth embodiment of the holding system in accordance with the invention will be explained in closer detail by reference to FIGS. 16 to 19. This embodiment is built similar to the first embodiment as shown in FIGS. 5 to 8, but with the difference that the spring 12 and the joint 4 are not two separate components, but are combined in the form of a solid joint 20. As is shown in particular in FIG. 18, the solid joint 20 is part of a solid joint element 21 which comprises two first solid joint arms 22 and one interposed second solid joint arm 23. The two first solid joint arms 22 extend at a distance parallel adjacent to one another and are connected to each other at an end by means of a transverse arm 24. The second solid joint arm 23 which is arranged between the two solid joint arms 22 is elastically connected at one end to the transverse arm 24 and freely movable at the other end. The second solid joint arm 23 can therefore be pivoted in the manner of a tongue relative to the first solid joint arms 22. The transverse arm 24 and therefore the solid joint 20 are disposed relative to the placement head 2 on the same side as the free end of the support arm 10 of the placement head support 1.

Figure 17:
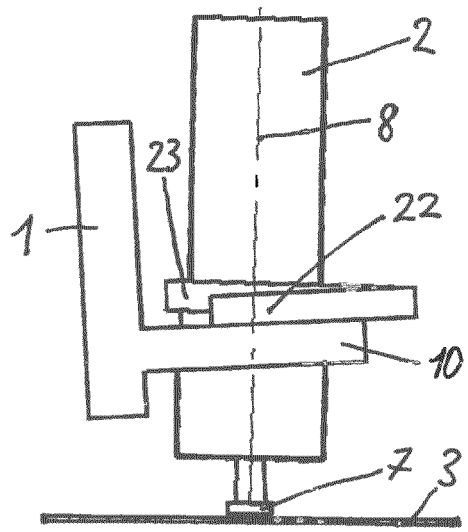
FIG. 17 shows the arrangement of FIG. 16 when pressing against a substrate.
Figure 18:
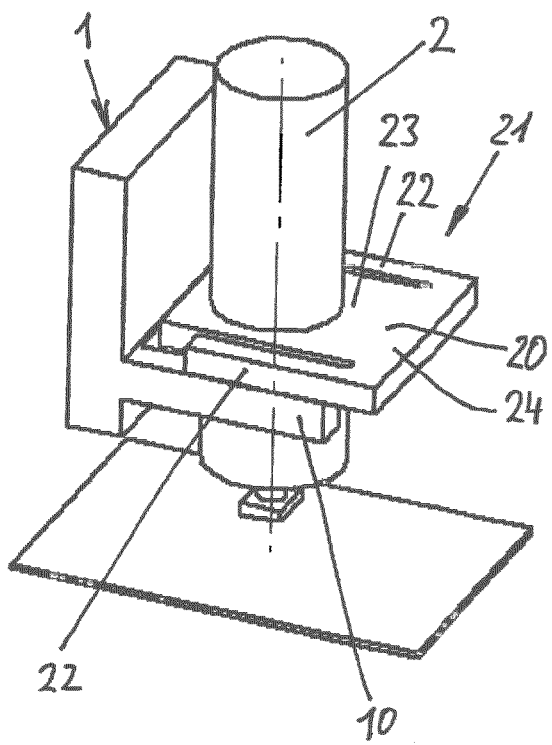
FIG. 18 shows the arrangement of FIG. 16 in a spatial representation.
Figure 19:
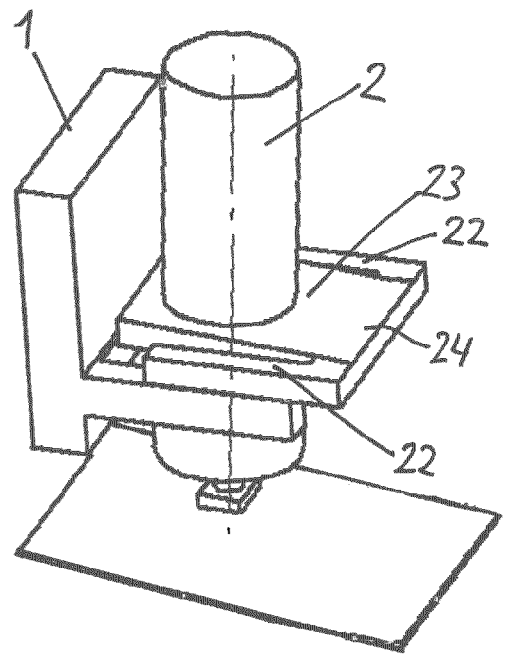
FIG. 19 shows the arrangement of FIG. 17 in a spatial representation.

In the illustrated embodiment, the second solid joint arm 23 is shaped in the manner of a plate, wherein it comprises a through-opening through which the placement head 2 is guided. Furthermore, the placement head 2 is rigidly connected to the second solid joint arm 23. When the component 7 is placed on the substrate 3 and pressed against the same (as shown in particular in FIG. 17), the free end of the second solid joint arm 23 pivots upwardly relative to the first solid joint arms 22 as a result of the pressing reaction force when the placement head 2 is pressed into the oblique position as shown in FIGS. 17 and 19 which is caused by the deformation of the placement head guide device 18. The elasticity of the solid joint 20 is adjusted to the deformation of the placement head guide device 18 in such a way that the predetermined alignment of the placement head 2 and consequently the plane-parallel alignment of the component 7 relative to the surface of substrate 3 is maintained.

Figure 2:
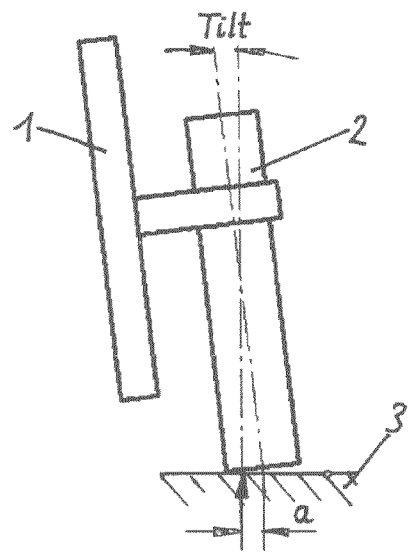
FIG. 2 shows an illustration according to FIG. 1 for illustrating a deformation-induced axis error during the pressing of the placement head against a substrate.

It will be explained below in closer detail by reference to FIGS. 3 and 4 how the lateral offset a (see FIG. 2) can be minimized by special arrangement of the rotational axis 26 of the placement head 2 relative to a deformation rotational axis 25 of the placement head guide device 18. This will be further explained in FIGS. 3 and 4 by reference to a placement head alignment device whose principal configuration substantially corresponds to the one shown in FIGS. 16 to 19. The principle of arranging the rotational axes in a specific relative position with respect to each other for preventing the lateral offset as explained by reference to FIGS. 3 and 4 can be applied to all embodiments of the invention.

Figure 3:
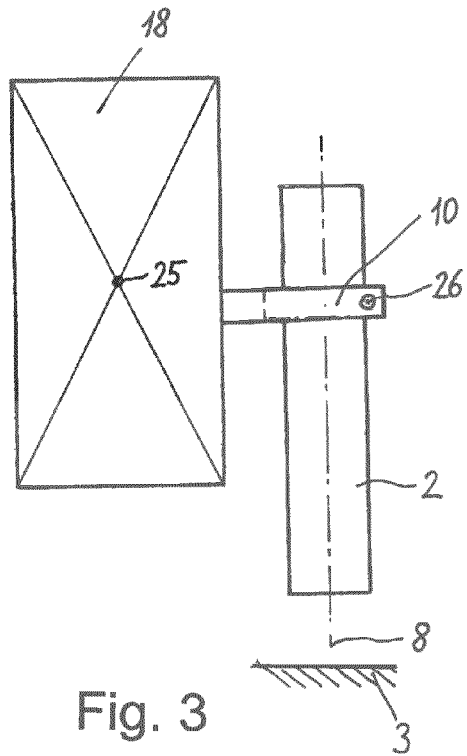
FIG. 3 shows a schematic illustration of a holding system in accordance with the invention, whose principal configuration approximately corresponds to the one of FIGS. 16 to 19, in the unloaded state, including the indication of the relative position of the rotational axes.

FIG. 3 shows the placement head guide device 18 and the placement head 2 in the unloaded state, i.e. when the placement head 2 or the component that is sucked up by the placement head 2 has not yet been placed on the substrate 3. This unloaded state is also shown in FIG. 4 with the dot-dash lines. The illustration shows that the rotational axis 26 of the placement head 2 is situated in the unloaded state at a lower level by a measure $h_1$ than the deformation rotational axis 25, which forms the deformation-induced rotational center of the placement head guide device 18 when the placement head 2 is pressed on the substrate 3 and a respective reaction force F acts from below on the placement head 2 (FIG. 4).

Figure 4:
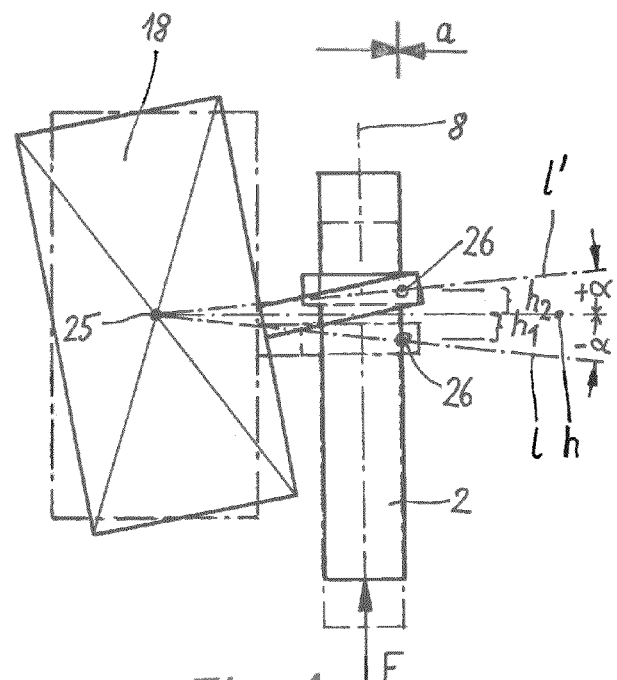
FIG. 4 shows the holding system of FIG. 3 in the unloaded and loaded state for illustrating a minimal lateral offset.

FIG. 4 shows the deformation-induced twisting of the placement head guide device 18 after pressing against the substrate 3 and the changed relative position of the placement head 2 relative to the placement head guide device 18 with solid, unbroken lines. In the illustrated embodiment, as a result of the reaction force F, the rotational axis 26 of the placement head 2 pivots upwardly in a counterclockwise manner on a circular arc about the deformation rotational axis 25 of the placement head guide device 18. If the placement head guide device 18 acts in such a way that the rotational axis 26 of the placement head 2 lies at the predetermined pressing force with which the components are pressed against the substrate 3 by a measure $h_2$ above the deformation axis 25 which is as large as the measure $h_1$ by which the rotational axis 26 lies in the unloaded state beneath the deformation rotational axis 25, the lateral offset a which occurs by the deformation is equal 0. It is therefore advantageous for minimizing the lateral offset a when the rotational axis 26 is situated at a lower level in the unloaded state than the deformation rotational axis 25, whereas the rotational axis 26 is situated at the same level under half the placement force and above the deformation rotational axis 25 under full placement force.

FIG. 4 shows that a straight line 1 through the rotational axis 26 of the placement head joint and the deformation rotational axis 25 of the placement head guide device 18 is situated in the unloaded state lower by an angle $-\alpha$ than a horizontal plane h which is situated at the height of the deformation axis 25. When the placement head 2 or the component is pressed against the substrate 3, said straight line, which is designated with reference numeral 1' in FIG. 4, is higher by the angle $+\alpha$ than the horizontal plane h. It is advantageous within the goal of minimizing the lateral offset a when said straight line 1 moves within an angular range which lies between +45° and −45° relative to the horizontal plane h. The scope of the movement is usually relatively small and is typically 10° at most, preferably 5° at most. In this respect it is also possible as an alternative to the embodiment shown in FIG. 4 that the rotational axis 26 moves between the unloaded and loaded state in such a way that the straight line 1 either moves only in the "−α" range or only in the "+α" range.

The invention therefore provides a kinematic holding system in which a deformation of the placement head guide device 18 which is caused by the pressing is compensated in at least one axis. This is either realized by a passive element as described above by reference to the first and fifth embodiment, or by means of at least one active element in form of an actuator 13, as explained in connection with the second to fourth embodiments. When passive elements are used, the adjustment of the deformation of the overall system with the geometric arrangement and the stiffness of the passive element is relevant. The passive tilt compensation is provided without the actuator 13 and can be integrated both in the placement head support 1 and in the placement head 2.

It is further possible to arrange the length-variable holding members for the placement head 2 or the solid body joint element 21, respectively, or to combine several of the holding members or solid joint elements 21 with each other in such a way that not only deformation-induced pivoting movements of the placement head guide device 18 about the Y axis (as shown in the drawings) are compensated, but also pitching and/or rolling movements of the placement head 2 about other axes caused by the pressing force.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except by the appended claims and their equivalents.

The invention claimed is:

1. Kinematic holding system for a placement head of a placement apparatus for mounting electronic or optical components on a substrate, comprising:
   a placement head guide device comprising a placement head support for holding the placement head; and
   a placement head alignment device for adjusting the alignment of the placement head relative to the placement head support, wherein the placement head alignment device comprises a joint via which the placement head is supported in an inclination-adjustable way on the placement head support, and wherein the placement head alignment device comprises at least one length-variable holding member which is arranged at a distance from the joint between the placement head support and the placement head and which determines a pivoting position of the placement head relative to the placement head support and whose length is changeable during the placement operation depending on a deformation of the placement head guide device caused by a pressing force of the placement head against the substrate in such a way that an axis error of the placement head caused by the deformation of the placement head guide device is compensated.

2. Holding system according to claim 1, wherein the length-variable holding member has a longitudinal axis which is arranged parallel or transversely to a longitudinal axis of the placement head.

3. Holding system according to claim 1, wherein the placement head is pivotably mounted by means of a placement head console on the placement head support, and wherein the length-variable holding member is supported on the placement head console.

4. Holding system according to claim 1, wherein the placement head alignment device comprises a plurality of joint rods which are connected via joints both to the placement head and also the placement head support, and which hold the placement head in a predetermined variable position relative to the placement head support, wherein the relative position of the joint rods is variable by means of the length-variable holding member in such a way that a deformation-induced axis error of the placement head is compensated.

5. Holding system according to claim 1, wherein the length-variable holding member consists of a passive element in form of a spring, which is arranged in such a way between the placement head support and the placement head that the pressing force is transferred by the placement head support to the placement head via the joint on the one hand and via the spring on the other hand, wherein a reaction force produced by the pressing force produces a change in a length of the spring.

6. Holding system according to claim 1, wherein the length-variable holding member consists of an actuator which is either travel-controlled or force-controlled.

7. Holding system according to claim 6, wherein the actuator comprises an electric direct drive, a voice coil or a piezo drive.

8. Holding system according to claim 6, wherein the actuator acts on an axial position of the placement head via a lever arrangement or a gear.

9. Holding system according to claim 1, wherein the placement head alignment device comprises a motion blocking device for blocking the relative movements of the placement head relative to the placement head support.

10. Holding system according to claim 6, wherein the actuator is formed as a lockable actuator.

11. Holding system according to claim 1, wherein the placement head is suspended in its upper or bottom end region in pendulum fashion on the placement head support, and is supported in a Z direction by means of a joint which has at least one rotary degree of freedom, and that the at least one length-variable holding member is provided beneath or above the joint for adjusting the inclination of the placement head relative to the placement head support.

12. Holding system according to claim 11, wherein the joint is arranged as a single-axis joint, ball-and-socket joint or a universal joint.

13. Holding system according to claim 1, wherein a plurality of length-variable holding members is provided, which are arranged in such a way that they act from different directions on the placement head, so that the placement head can be pivoted multi-dimensionally in space.

* * * * *